(12) United States Patent
Jones

(10) Patent No.: US 6,931,834 B2
(45) Date of Patent: Aug. 23, 2005

(54) COOLING SYSTEMS

(75) Inventor: Alan R. Jones, Derby (GB)

(73) Assignee: Rolls-Royce plc, London (GB)

( * ) Notice: Subject to any disclaimer, the term of this patent is extended or adjusted under 35 U.S.C. 154(b) by 105 days.

(21) Appl. No.: 10/419,254

(22) Filed: Apr. 21, 2003

(65) Prior Publication Data

US 2004/0020213 A1 Feb. 5, 2004

(30) Foreign Application Priority Data

May 1, 2002 (GB) .............................................. 0209946

(51) Int. Cl.⁷ .............................................. F02K 3/02
(52) U.S. Cl. ......................... 60/226.1; 60/730; 60/736
(58) Field of Search ................................ 60/730, 39.83, 60/736, 226.1; 415/114; 165/105, 153, 104.33, 104.21, 167, 110

(56) References Cited

U.S. PATENT DOCUMENTS

| | | | | |
|---|---|---|---|---|
| 4,027,728 A | | 6/1977 | Kobayashi et al. | |
| 4,190,398 A | * | 2/1980 | Corsmeier et al. | 415/114 |
| 4,273,304 A | * | 6/1981 | Frosch et al. | 244/117 A |
| 4,280,333 A | * | 7/1981 | Corliss et al. | 62/259.1 |
| 4,705,102 A | | 11/1987 | Kanda et al. | |
| 4,773,473 A | | 9/1988 | Konitzer | |
| 5,203,399 A | * | 4/1993 | Koizumi | 165/104.33 |
| 5,349,499 A | * | 9/1994 | Yamada et al. | 361/700 |
| 5,427,174 A | * | 6/1995 | Lomolino, Sr. et al. | 165/104.13 |
| 5,522,452 A | * | 6/1996 | Mizuno et al. | 165/286 |
| 5,987,877 A | * | 11/1999 | Steiner | 60/39.08 |
| 6,000,210 A | * | 12/1999 | Negulescu | 60/772 |
| 6,076,595 A | * | 6/2000 | Austin et al. | 165/104.26 |
| 6,134,878 A | * | 10/2000 | Amako et al. | 60/801 |
| 6,282,881 B1 | * | 9/2001 | Beutin et al. | 60/39.08 |
| 6,295,803 B1 | * | 10/2001 | Bancalari | 60/39.511 |
| 6,532,744 B1 | * | 3/2003 | Reiter et al. | 60/782 |
| 6,564,861 B1 | * | 5/2003 | Miyazaki et al. | 165/104.29 |
| 6,584,778 B1 | * | 7/2003 | Griffiths et al. | 60/782 |
| 6,668,913 B2 | * | 12/2003 | Gallarda | 165/110 |
| 6,672,075 B1 | * | 1/2004 | Sandu et al. | 60/806 |
| 6,704,200 B2 | * | 3/2004 | Zeighami et al. | 361/700 |
| 2004/0040328 A1 | * | 3/2004 | Patel et al. | 62/259.2 |

FOREIGN PATENT DOCUMENTS

| | | |
|---|---|---|
| EP | 1003006 A | 5/2000 |
| GB | 1314536 P | 4/1973 |
| GB | 1401724 P | 7/1975 |

* cited by examiner

Primary Examiner—Cheryl Tyler
Assistant Examiner—William H. Rodriguez
(74) Attorney, Agent, or Firm—W. Warren Taltavull; Manelli Dension & Selter PLLC

(57) ABSTRACT

Apparatus for maintaining the temperature of a component of a gas turbine engine below a predetermined maximum working temperature comprises a reservoir for a cooling fluid having a boiling point below the working temperature and in which the component is immersed or with which it is in contact. At least two heat exchangers are associated with the reservoir and operable to effect condensation of vaporized cooling fluid and return of same to the reservoir. Preferably the apparatus is a closed system incorporating three heat exchangers respectively adapted to effect heat exchange with engine fuel, compressed air derived from a fan or low pressure compressor of the engine and ambient air. Means may advantageously be provided to ensure return of condensed cooling fluid to the reservoir when the attitude of the reservoir is altered as a result of aircraft maneuvers.

34 Claims, 8 Drawing Sheets

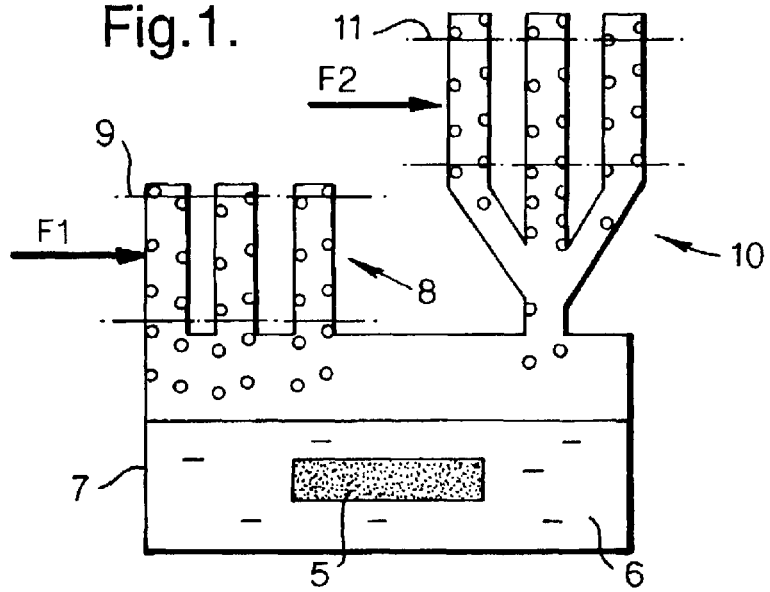
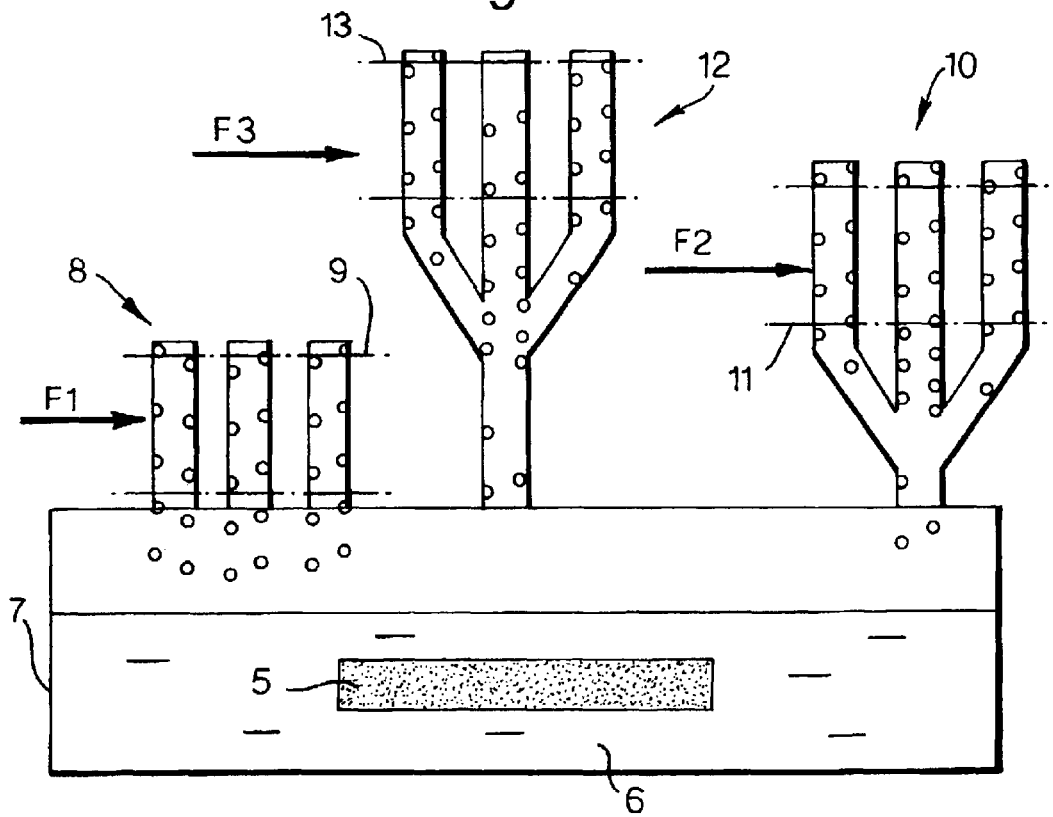

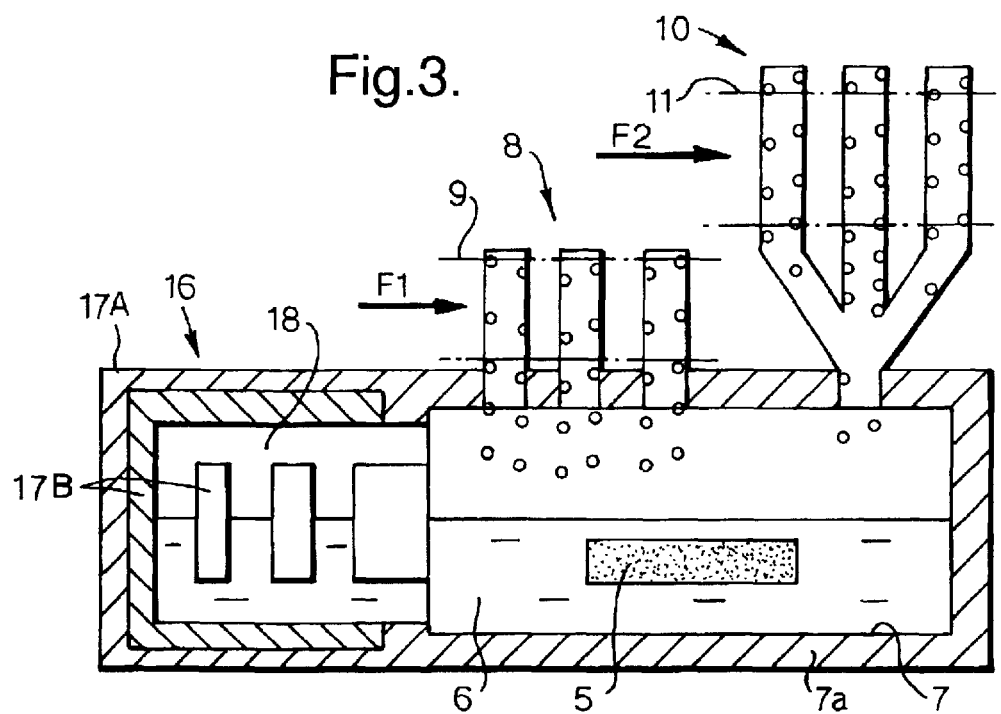
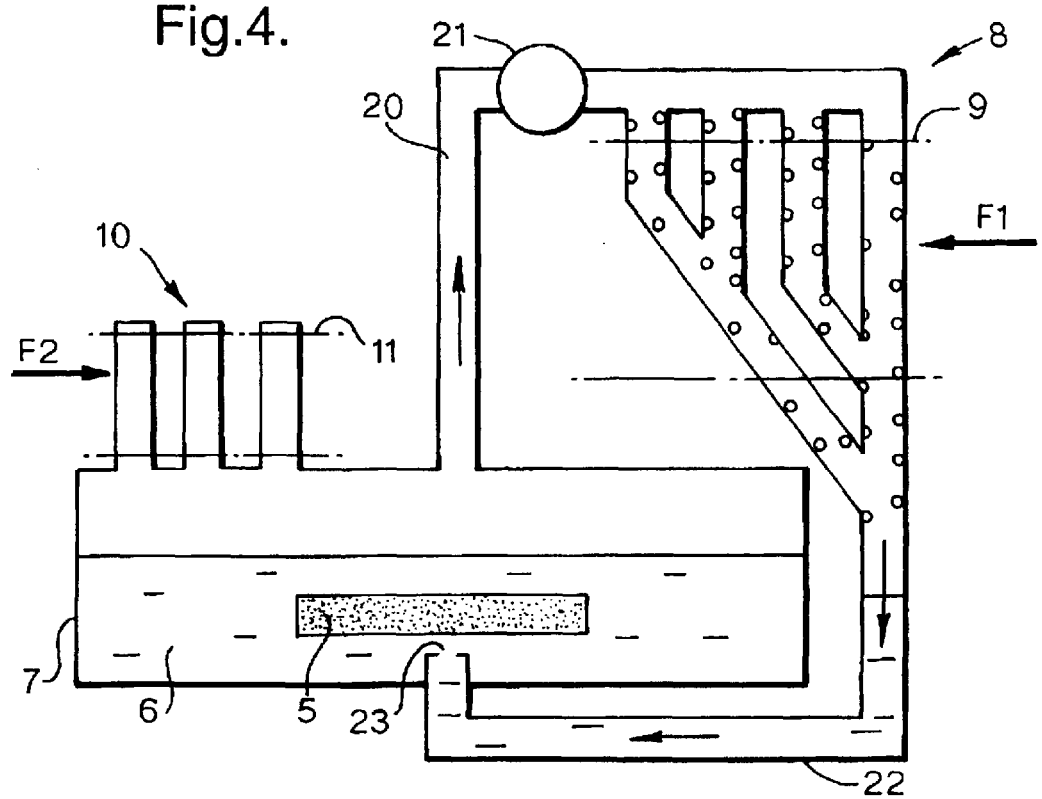

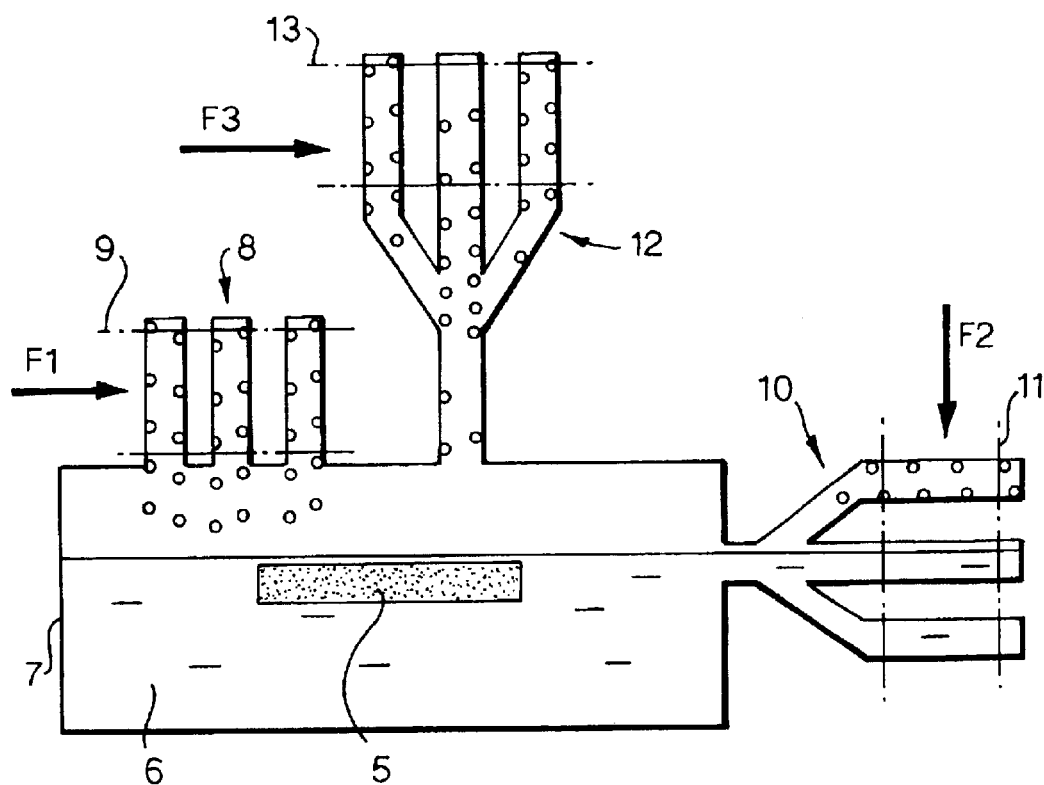

COOLING SYSTEMS

FIELD OF THE INVENTION

This invention relates to cooling systems and is particularly, but by no means exclusively applicable to cooling of electronic components or of fuel in gas turbine aircraft engines. The invention may also be applied to marine, rail, road or other vehicles or used in other situations.

BACKGROUND OF THE INVENTION

The primary power requirement of an aircraft is for thrust which is provided from its main engine or engines. In a large proportion of aircraft the main engine or engines are gas turbine engines. These conventionally also provide the majority of the secondary power of the aircraft which typically includes hydraulic power to move control surfaces and landing gear, electrical power for control systems, lighting and the like and compressed air power to provide environmental control within the aircraft. Typically the secondary power requirements are derived by mechanical transmission from the aircraft engine or engines which transmission drives one or more electric generators, hydraulic pumps and compressors.

Provision of secondary aircraft power by electrical means has the potential to improve efficiency, reliability and maintainability of aircraft, but requires the use of high power electronic devices, the temperature of which requires to be controlled to ensure satisfactory operation and long life. It has previously been proposed to effect cooling of power electronics by attaching the electronic devices to water cooled aluminium heat sinks. However these are both bulky and relatively heavy and not therefore satisfactory for aero engine applications where weight and volume require to be minimised.

In a wider context, the cooling of electronic or other components is often required in situations where the cooling capacity of an available heat sink may vary over time due to external factors. It may in some circumstances be possible to increase the maximum heat absorbing capacity of the heat sink, but that would inevitably result in increased size and cost and provide over capacity in all but the maximum condition. In other cases it may for various reasons not be possible to increase the capacity of an available heat sink.

SUMMARY OF THE INVENTION

According to one aspect of the present invention there is provided apparatus for maintaining the temperature of a component below a predetermined maximum temperature, the apparatus comprising a reservoir for a cooling fluid having a boiling point below said temperature said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature.

Both of said heat exchangers may be of variable heat exchange capacity in which case the minimum combined heat exchange capacity of the heat exchangers is arranged to be sufficient to maintain the temperature of said component below said predetermined maximum temperature.

The apparatus may include one or more further heat exchangers of fixed or variable heat exchange capacity, the combined minimum heat exchange capacity of all of said heat exchangers being sufficient to maintain the temperature of said component below said predetermined maximum temperature.

As applied to cooling of a component of a gas turbine engine, one of said heat exchangers may be adapted to effect heat exchange with compressed air derived from a low pressure compressor or fan of the engine. The other or another of said heat exchangers may be adapted to effect heat exchange with engine fuel. Preferably the apparatus incorporates three heat exchangers respectively adapted to effect heat exchange with engine fuel, compressed air derived from said fan or low pressure compressor of the engine and ambient air.

The ability of said heat exchangers to operate as such is dependent on the temperature differential between the vapour derived from said cooling fluid and the heat exchange medium, that is fuel, compressed air or ambient air. This temperature differential will vary dependent on operating conditions and accordingly the apparatus is preferably adapted to transfer heat automatically in whichever one or more of said heat exchangers is operable under particular engine operating conditions. Alternatively the apparatus may include control means operable to close-off communication between one or more of said heat exchangers and said reservoir. The control means may comprise thermostatic valves.

Preferably said heat exchangers are disposed above said reservoir such that condensed cooling fluid is returned to said reservoir by gravity. The apparatus may also include means operable to ensure return of condensed cooling fluid to said reservoir when the attitude of the reservoir is altered, for example as a result of aircraft manoeuvres. Such means may comprise pump means operable to return condensate to said reservoir regardless of reservoir attitude. Alternatively at least one of said heat exchangers may project from the reservoir in a direction different from the other or others.

The component the temperature of which is to be maintained below a predetermined maximum temperature may comprise a housing containing power electronics devices. Alternatively the component may comprise a fuel supply line. The cooling fluid may comprise one or more of water, ammonia or a fluorinated hydrocarbon.

The invention also provides a method of maintaining the temperature of a component below a predetermined temperature, the method comprising cooling the component by evaporation of a cooling fluid having a boiling point below said temperature, effecting condensation of evaporated cooling fluid by heat exchange with one or more of two heat exchange mediums, the heat exchange capacity of at least one of which is variable between maximum and minimum levels, and maintaining the combined heat exchange capacity of the heat exchange mediums sufficient at all times to maintain the temperature of said component below said predetermined maximum temperature.

Preferably heat exchange is effected selectively in one or more of said heat exchange mediums dependent on variation in heat exchange capacity of said variable capacity heat exchange medium. As applied to cooling of a component of a gas turbine engine heat exchange is advantageously effected with any one or more of compressor air, engine fuel or ambient air.

BRIEF DESCRIPTION OF THE DRAWINGS

Embodiments of the invention will now be described, by way of example only, with reference to the accompanying diagrammatic drawings, in which:

FIG. 1 shows one form of apparatus for cooling power electronics in a gas turbine aircraft engine, using heat exchange with fan air and/or engine fuel;

FIG. 2 shows an alternative embodiment enabling heat exchange with fan air, engine fuel and ambient air;

FIG. 3 shows a further embodiment including means for storing heat for heat transfer purposes;

FIG. 4 shows an alternative system providing for pumped return of condensed vapour;

FIG. 5 shows a modification of the embodiment of FIG. 2 adapted to counter changes in attitude of the aircraft;

DETAILED DESCRIPTION OF THE INVENTION

Figure 2A:
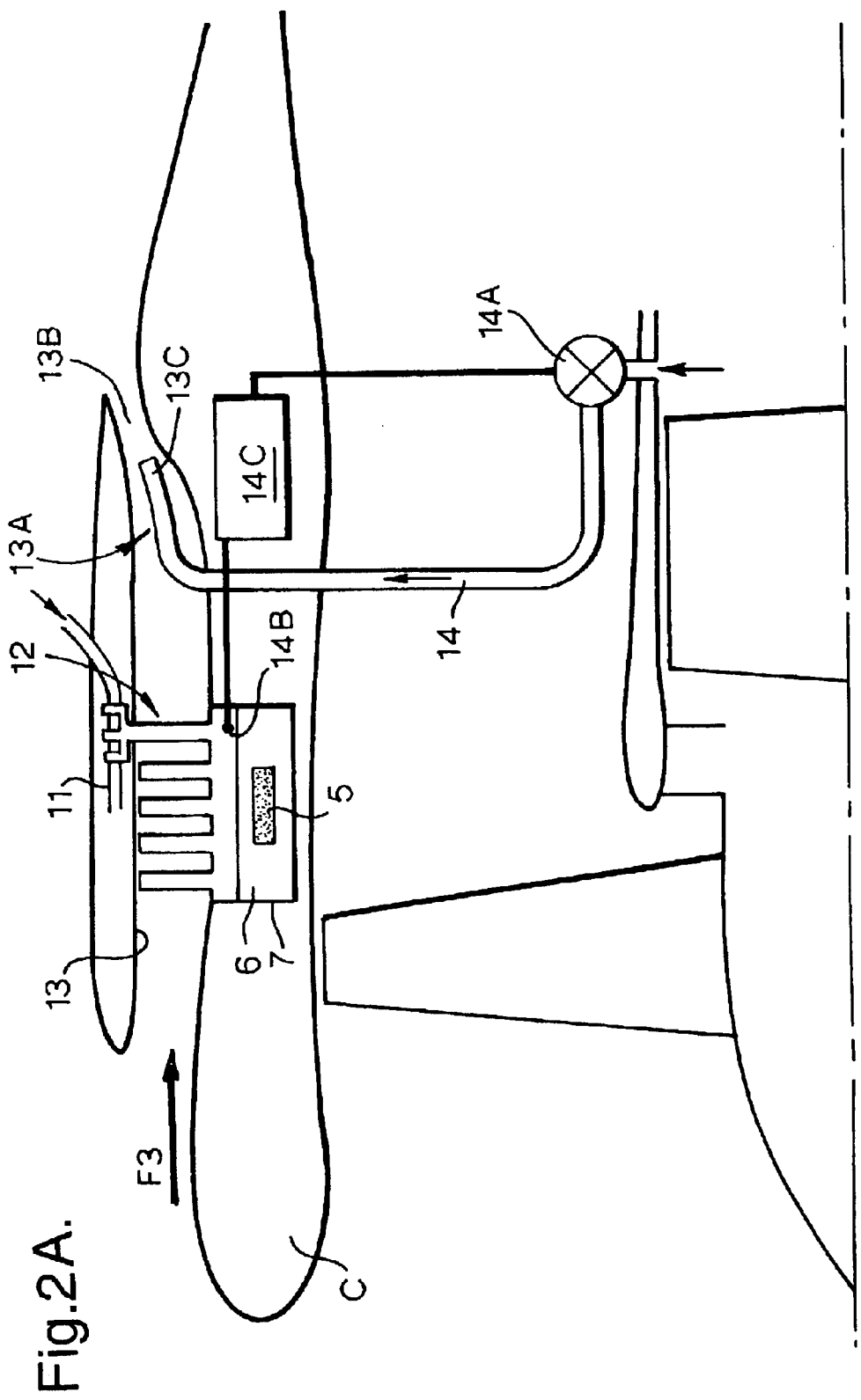
FIGS. 2a and 2b show modifications of the embodiment shown in FIG. 2.

FIG. 1 illustrates a cooling system for power electronics of a gas turbine engine. The electronic devices are housed in a casing 5 immersed in a high electrical resistivity thermal transfer liquid 6 contained in a sealed reservoir 7. The liquid may comprise water or preferably an electrically insulating liquid such as Fc77 produced by Minnesota Mining and Manufacturing Company of St. Paul, Minn., U.S.A. A first heat exchanger 8 is formed integrally with the reservoir 7 and is disposed in a duct 9 through which compressed air derived from the fan or low pressure compressor of the engine may flow in the direction of arrow F1. A second heat exchanger 10 is also connected to the chamber 7 and is disposed in a duct 11 through which engine fuel may flow in the direction of arrow F2.

The electronic components contained in the housing 5 may serve to control supply of power from the aircraft to the engine to start the engine and from the engine to the aircraft for operation of aircraft control surfaces and landing gear and/or may power a compressor providing compressed air for environmental control within the aircraft. Typically power electronic devices such as insulated gate bipolar transistors or other devices which are silicon based will be employed in this electronic circuitry which requires to be maintained below a predetermined temperature, generally around 125° C., for effective operation and long life. Heat generated by the power electronics is transmitted through the housing 5 to the liquid 6 in the reservoir 7 resulting in boiling of the liquid, the resultant vapour collecting in the heat exchangers 8 and 10. This vapour is then condensed by heat exchange with the fan air F1 and/or fuel F2 in the respective heat exchangers as described hereafter. The surface of the casing 5 may be treated or coated so as to promote nucleation of vapour bubbles during boiling of the liquid.

During take-off when the engine develops maximum thrust, the fan air will be at a relatively high temperature. This will inhibit condensation of vapour in the heat exchanger 8. Consequently this heat exchanger does not contribute substantially to vapour condensation under take-off conditions. However at take-off the fuel flow rate is high and the fuel is therefore capable of absorbing substantial amounts of heat in the heat exchanger 10. Accordingly under take-off conditions condensation of vapour boiled off from the reservoir 7 is effected primarily in the heat exchanger 10. This suppresses the vapour pressure in the closed system and enables the electronic devices to continue to lose heat to the liquid 6 and thus remain below the operating temperature required for optimum operation.

At lower engine power conditions, for example when the aircraft is operating at cruising speed, the fuel flow F2 reduces considerably and the heat removed from the heat exchanger 10 is thus reduced. However under cruise conditions the air from the engine fan is at a lower temperature than during take-off and the resultant temperature differential between the fan air and the vapour in the heat exchanger 8 enables the vapour to condense in the heat exchanger 8 thereby enabling the electronic power devices to continue to reject heat to and boil-off the liquid 6.

Thus by virtue of the provision of two heat exchangers, one exchanging heat with fan air and the other with engine fuel, the arrangement shown in FIG. 1 enables power electronic components to be adequately cooled during different engine operating conditions. However under some conditions, for example during a transient engine manoeuvre such as deceleration from a high power condition, the flow of fuel will reduce and may become incapable of absorbing all the heat rejected from the electronic devices before the temperature of the fan air drops to a level which enables it to absorb the balance of the heat to be removed. FIG. 2 shows a modified arrangement for dealing with such conditions. As in the case of FIG. 1 the power electronics 5 are immersed in water or other suitable liquid 6 in a reservoir 7 to which a vapour to fan air heat exchanger 8 and a vapour to engine fuel heat exchanger 10 are connected. However in the FIG. 2 arrangement, a third heat exchanger 12 is also connected to the reservoir 7. This heat exchanger is located in a duct 13 through which flows ambient air F3 drawn from around the engine. Most transient engine conditions are likely to occur when the aircraft has a rapid flow of cold ambient air passing it and the heat exchanger 12 therefore provides a third means of withdrawing heat and thus condensing vapour in the heat exchanger for return to the reservoir 7. Thus in the FIG. 2 arrangement heat may be withdrawn from the system by heat exchange with engine fuel, fan air or ambient air dependent on different conditions during the flight cycle thus ensuring adequate cooling of the power electronic devices at all such times.

In order to counter zero or low flow of ambient air when an aircraft is on the ground, the ambient air heat exchanger may be connected to an ejector pump or an electrically or mechanically driven fan. The former arrangement is shown in FIG. 2A in which the reservoir 7 is incorporated in an engine cowling C with the ambient air heat exchanger 12 projecting into an air flow passage within the cowling through which ambient air flows in the direction of arrow F3. An ejector pump comprising a narrow throat or passage 13B and a nozzle 13C is adapted to introduce a flow of compressed air derived from the low pressure compressor of the engine through a pipe 14 into the passage 13B. A valve 14A is fitted in the pipe 14 and is operable to close the pipe when there is sufficient flow of ambient air through the heat exchanger 12 to render the ejector pump unnecessary. This is sensed by a temperature sensor 14B disposed in the upper section of the reservoir 7 above the cooling liquid 6 and connected to the valve 14A through a control unit 14C.

Figure 2B:
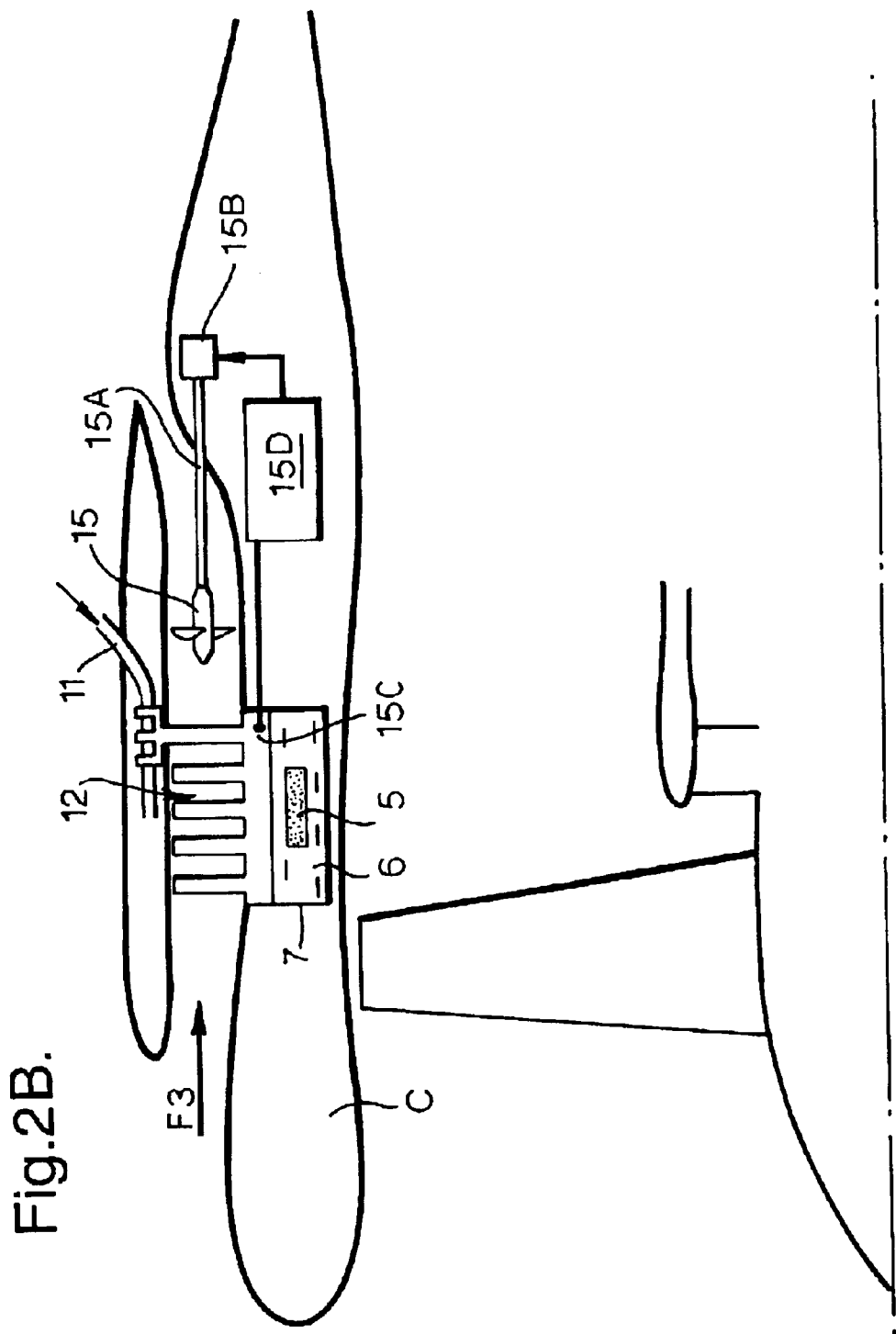

FIG. 2B shows a similar arrangement in which the ejector pump 13A is replaced by a fan 15 connected through a shaft 15A to an electric motor 15B which, like the ejector pump 13A is brought into operation when there is insufficient flow of ambient air through the heat exchanger 12. This is effected by means of a temperature sensor 15C mounted in the upper region of the reservoir 7 above the level of the cooling liquid 6 and connected to the electric motor 15B through a control unit 15D.

FIG. 3 shows an alternative arrangement in which the main reservoir 7 is provided with a jacket 7a of thermally insulating material and an insulated chamber 16 is provided at one end of the reservoir 7 and acts as a form of self-contained heat exchanger. The chamber 16 comprises an outer wall 17A of thermal insulating material and an inner body 17B of a material having high thermal conductivity and high specific heat capacity in which flow passages are machined. The chamber is connected in fluid communication with the main reservoir 7 in which the power electronics 5 are located such that the liquid 6 extends into the lower portion of the chamber 16 which constitutes a boiling region. The upper portion 18 of the chamber constitutes a condensing region in which vapour derived from boiling-off of the liquid 6 may be condensed and returned to the boiling region below. By virtue of this construction, coolant liquid 6 may be boiled-off in the lower portion of the chamber 16 and vapour may condense in the upper portion, the temperature of which, by virtue of the chamber construction, is maintained relatively low.

The purpose of the insulated chamber 16 is to introduce thermal inertia by providing cooling over short periods of time during which transient engine operating conditions result in increases in temperature of the fan air or fuel, thus reducing the effectiveness of the heat exchangers 8 and 10. When the fan air or fuel are sufficiently cool to remove heat from the system, boiling of coolant liquid 6 occurs in the lower portion of the chamber 16. If, for short periods during an engine manoeuvre both the fan air and fuel temperatures rise above the temperature within the chamber 16 so that neither can remove heat from the chamber, condensation of vapour previously boiled-off by the electronic devices 5 will occur in the chamber 16. The size and thermal mass of this chamber may be matched to the quantity of heat it may be required to absorb during any transient engine conditions in which it will come into operation. It should be noted that while in FIG. 3 the chamber 16 is shown in association with the embodiment shown in FIG. 1, it may equally be used in conjunction with the FIG. 2 or other embodiments described herein.

FIG. 4 shows a system incorporating alternative means to ensure satisfactory cooling of the power electronics in the event of transient engine conditions. As in the previous embodiments the electronics are contained within a casing 5 immersed in water or other suitable liquid 6 in a reservoir 7. A vapour to fuel heat exchanger 10 is connected to the chamber 7 together with a vapour to fan air heat exchanger 8. However in this embodiment the heat exchanger 8 is connected to the chamber 7 by a passage 20 incorporating a pump 21 at the inlet side of the heat exchanger and by a return passage 22 terminating in a throttle in the form of a nozzle 23 at the outlet side of the heat exchanger. The pump 21 serves to increase the pressure of the vapour within the heat exchanger 8 and the arrangement operates as a heat pump which enhances the ability to remove heat into the fan air when the temperature differential between the vapour to be condensed and the fan air is relatively low.

This arrangement has a number of advantages. Firstly it enables the vapour to fan air heat exchanger to be employed as the preferential heat exchanger thus minimising the heat transferred to the engine fuel in the heat exchanger 10. The capacity of fuel to accept waste heat is limited by its thermal stability which is most evident when the engine is at low power and the fuel flow is low. The embodiment of FIG. 4 is therefore beneficial under conditions where the increase in fuel temperature might threaten fuel stability, such as on or immediately after engine deceleration from high power. A further advantage of the FIG. 4 arrangement is that the differential between the pressure in the heat exchanger and the pressure in the liquid 6 surrounding the electronic component housing 5, may be used to create a forced convection or impingement of liquid coolant 6 on to the housing which will enhance heat transfer to the coolant. It should be appreciated that while in the FIG. 4 embodiment the pump 21 is associated with the vapour to fan air heat exchanger, a similar arrangement could be used alternatively, or in addition, in association with the vapour to ambient air or vapour to engine fuel heat exchangers.

A further advantage of the arrangement shown in FIG. 4 is that the pumped return of condensate from the vapour to fan air heat exchanger ensures condensate returns to the reservoir 7 regardless of the attitude of the aircraft. In the embodiments of FIGS. 1–3 and in the vapour to fuel heat exchanger in the FIG. 4 embodiment, return of condensate to the reservoir 7 is effected solely by gravity which cannot always be guaranteed. FIG. 5 shows an alternative method of dealing with this problem. The FIG. 5 embodiment corresponds essentially to the embodiment shown in FIG. 2 save that the vapour to fuel heat exchanger 10 extends horizontally from one end of the chamber 7 instead of being connected to its upper surface as in the FIG. 2 embodiment. The position and orientation of the heat exchanger 10 is designed such that in the event aircraft orientation and/or acceleration results in the cooling liquid 6 entering the vapour to fan air and vapour to ambient air heat exchangers, the power electronics 5 will remain submerged in cooling liquid 6 and the vapour to fuel heat exchanger will remain clear of coolant and will therefore function to receive and condense the vapour boiled-off from the reservoir under such conditions. This situation will arise primarily during acceleration or other aircraft manoeuvres in which flow of fuel will be high and therefore sufficient itself to provide adequate cooling of the power electronics within the housing 5.

It should be appreciated that while in FIG. 4 the vapour to fan air and vapour to ambient air heat exchangers are both shown connected to the upper surface of the chamber 7, these heat exchangers or portions thereof may also be connected to other surfaces of the chamber 7 or disposed at differing angles or dispositions to compensate for lack of gravitational return of condensate under certain operating conditions.

Figure 6:
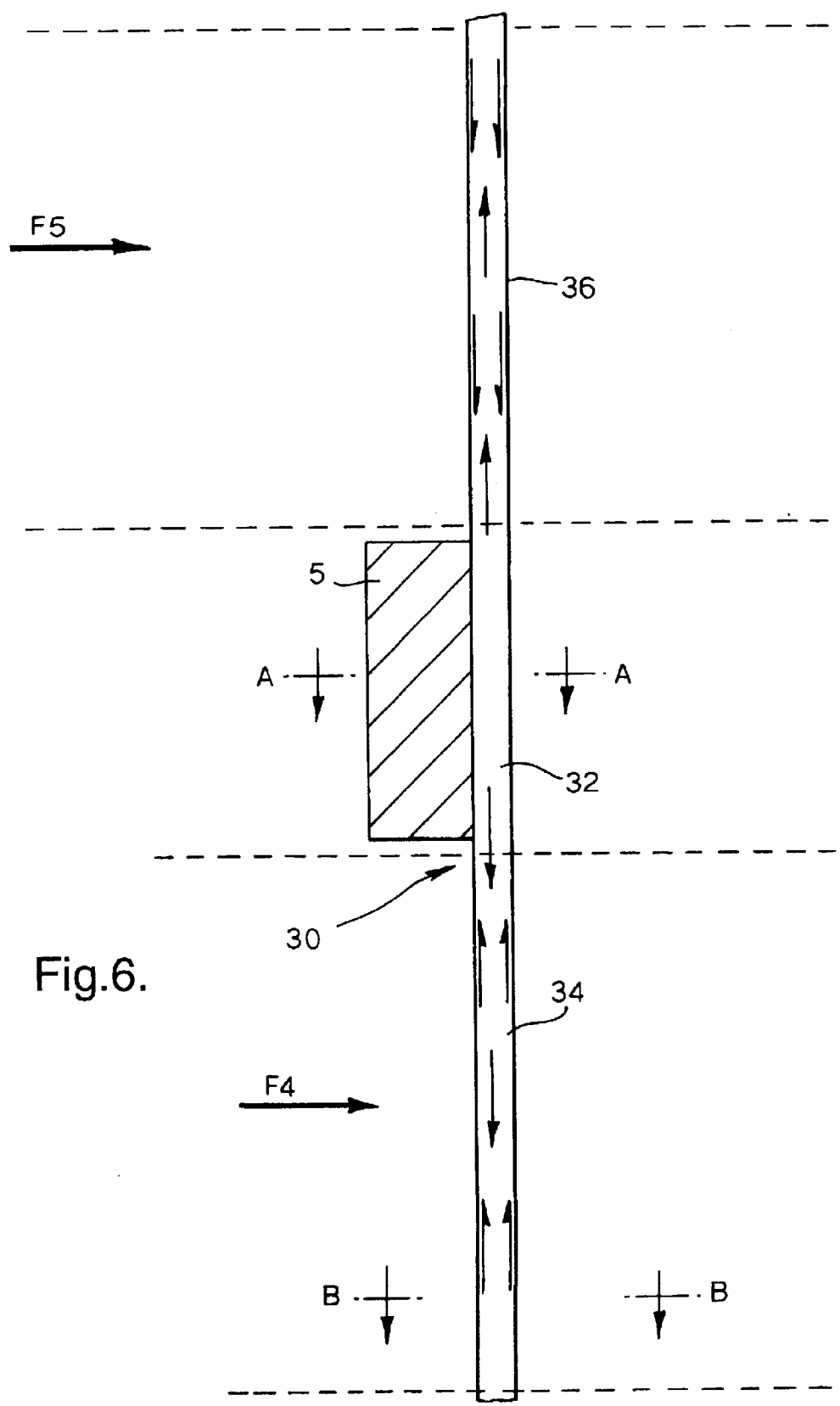
FIG. 6 shows an alternative embodiment of the invention.
Figure 6A:
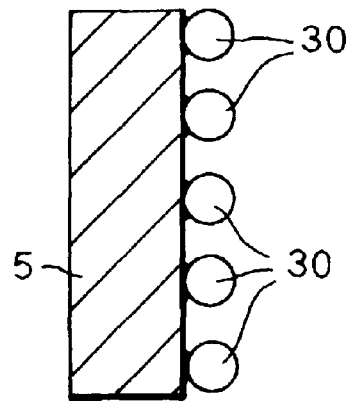
FIG. 6A is a cross-section on the line A—A in FIG. 6.
Figure 6B:
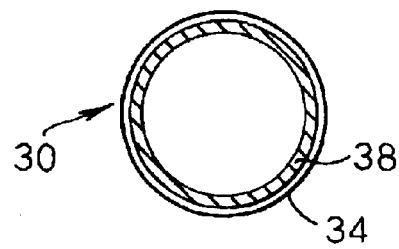
FIG. 6B is a cross-section through a heat pipe on the line B—B in FIG. 6.

FIGS. 6, 6A and 6B show an alternative arrangement in which the reservoir and heat exchangers of the previous embodiments are replaced by a plurality of heat pipes. The casing 5 containing the power electronics to be cooled is positioned adjacent to central regions 32 of a plurality of heat pipes 30. Each heat pipe extends above and below the casing 5, the lower section 34 in FIG. 6 being adapted to effect heat exchange with a flow of ambient air or fan air indicated by the arrow F4, and the upper section 36 being adapted to exchange heat with engine fuel flowing in the direction of arrow F5. The central section of each heat pipe comprises an evaporation region in which a fluid contained within the heat pipe is evaporated by withdrawal of heat from the casing 5. The resultant vapours travel along the heat pipe in opposite directions away from the central evaporation region to the end regions 34 and 36 which comprise condensation regions. As a result of heat exchange with the air and fuel flows in contact with these regions, the vapour in the heat pipes condenses on the inner surfaces of the pipes which comprise a gauze or wick 38 shown in FIG. 6C which serves as a path for return of condensed liquid to the central region 32 where the process is repeated.

Thus in this embodiment the casing 5 is not immersed in the coolant liquid, but is in heat transferable juxtaposition with it through surface contact between the central regions of the heat pipes 30 and the casing 5. By virtue of the wick effect provided by the gauze 38 or similar internal lining of the heat pipe, condensate from the lower section of each heat pipe is returned to the central evaporation zone against the pull of gravity. This produces the equivalent effect to a pump without moving parts and hence with increased reliability.

Figure 7:
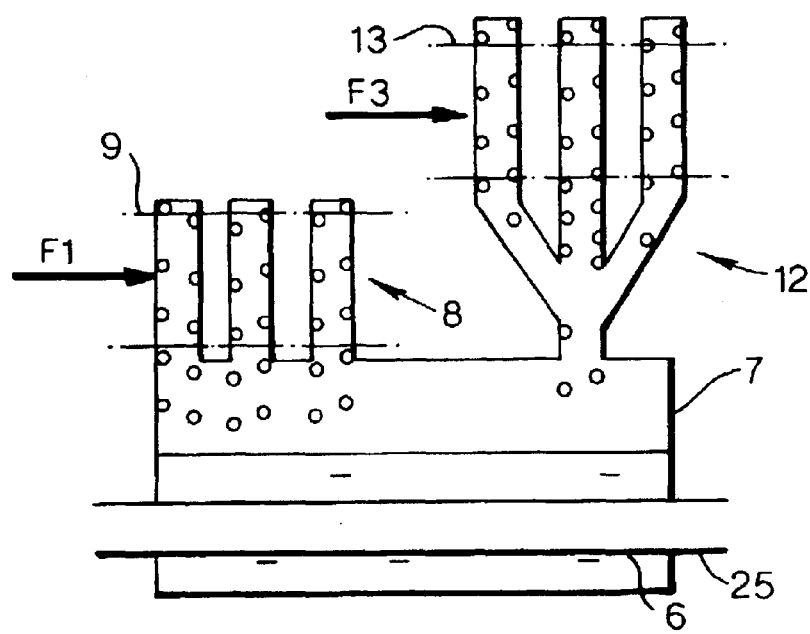
FIG. 7 shows an embodiment similar to FIG. 1 adapted for cooling of engine fuel.

FIG. 7 shows an arrangement in which a cooling system incorporating vapour to fan air and vapour to ambient air heat exchangers 8 and 12 is employed for cooling of fuel rather than electronic components. In this embodiment the heat exchangers are mounted on a chamber 7 in a manner similar to the previous embodiments, but the housing 5 containing power electronic components is replaced by a fuel pipe 25 extending through the chamber 7 and immersed in the water or other cooling liquid 6. The embodiment operates in the same manner as the previous embodiments, but serves to withdraw heat from the fuel passing through the pipe 25 thus cooling the fuel. This serves to ensure the temperature of the fuel does not reach that at which its thermal stability is threatened. The embodiment of FIG. 7 may be used independently of cooling of power electronic components or could be used in tandem to remove heat from fuel after the fuel had been heated in a vapour to fuel heat exchanger serving to cool power electronic components. The arrangement could also be used to cool oil or other fluids instead of or in addition to fuel.

The arrangements described operate automatically to extract heat from whichever one or more of the heat exchangers is suitable under different engine operating conditions, that is to say when the temperature of the fan air, fuel or ambient air is sufficiently low to produce effective heat transfer. In the illustrated embodiments this takes place automatically without requiring intervention of any control system. If required, however, an element of control may be incorporated by the provision of thermostatic valves to open or close the passages between the chamber 7 and one or more of the heat exchangers. The thermostatic valves may be controlled dependent on operating conditions to bring one or more of the heat exchangers into or out of operation as required. Alternatively, or in addition, thermostatic valves may be employed to open and close the passages introducing fan air, fuel or ambient air to the heat exchangers.

Figure 8:
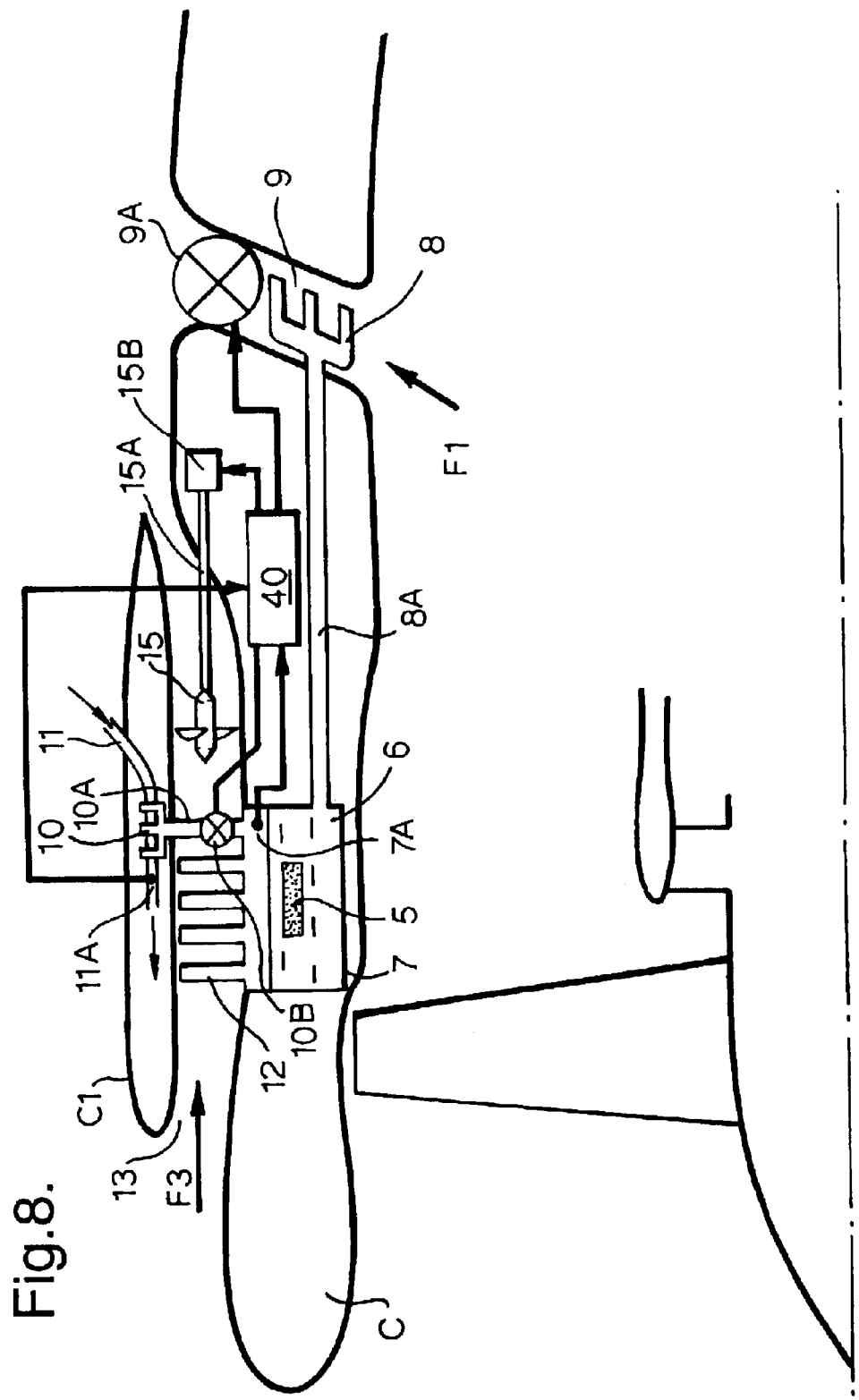
FIG. 8 shows an embodiment of the invention incorporated in an aircraft engine.

An arrangement of this kind is shown in FIG. 8 in which the casing 5 in which the power electronics are located is immersed in a cooling liquid 6 in a reservoir 7 mounted in an engine cowling C. A first heat exchanger 8 is connected to the reservoir 7 by a pipe 8A and is located in a passage 9 through which air is directed from within the fan casing in the direction of arrow F1. Flow of air through the passage 9 is controlled by a valve 9A.

A second heat exchanger 12 extends upwardly from the reservoir 7 into a passage 13 within the cowling assembly through which ambient air passes in the direction of arrow F3. A third heat exchanger 10 also extends upwardly from one end of the reservoir 7 into an outer section C1 of the cowling containing a fuel pipe 11 through which fuel flows in the direction of arrow F2. The passage 10A between the reservoir 7 and the heat exchanger 10 is controlled by a valve 10B. Valve 10B is linked through a control unit 40 to a motor driven fan arrangement 15, 15A, 15B similar to that described in FIG. 2B. A coolant temperature sensor 7B is located in the reservoir 7 and a fuel temperature sensor 11A in the fuel line 11.

The coolant temperature sensor 7B is linked through the control unit 40 to the fan motor 15B such that if the coolant temperature rises beyond a predetermined limit, the fan 15 is brought into operation to draw further ambient air over the heat exchanger 12. Similarly in the event of an unacceptable rise in fuel temperature, the temperature sensor 11A provides a signal to the control unit 40 operative to close the valve 10B and prevent further transfer of heat to the fuel in the heat exchanger 10.

In operation, valve 9A remains closed under most normal operating conditions. Thus, under high thrust engine conditions, for example during take-off, the temperature of the fan air is relatively high and would not contribute to cooling of the components in the reservoir 7. Valve 9A therefore remains closed and cooling of the components 5 is effected through heat exchange with ambient air in the heat exchanger 12 and with fuel in the heat exchanger 10. Likewise under normal cruise conditions, the valve 9A remains closed so long as there is sufficient cooling capacity in the heat exchangers 12 and 10.

Heat exchanger 8 is most likely to come into operation in the event of the aircraft attitude flooding the heat exchangers 10 and 12 or if one of these heat exchangers is flooded and fuel flow is low. Such conditions are most likely to arise during flight when the fan air temperature will be relatively low. Valve 9A can then be opened by the control unit 40 in response to a signal from the temperature sensor 7B to allow fan air to flow through the passage 9 and effect heat exchange with the liquid 6 in the heat exchanger 8 to assist in cooling of the electronic devices 5.

Cooling of the electronic components 5 may also be required on engine start-up or when "dry cranking" an engine during maintenance operations. These operations are effected on the ground when there is little or no flow of ambient air or fan air, and in the case of dry cranking, of fuel, but heat is generated in the electronic components in turning over the engine. Under such conditions the control unit 40 is operable in response to a signal from the temperature sensor 7B to select the heat exchanger or heat exchangers most appropriate to effect cooling under the prevailing conditions. At engine start-up fuel flow may not be sufficient to provide the necessary cooling through heat exchanger 10, and in this case and in the case of dry cranking the fan 15 may be brought into operation to increase flow of ambient air through the heat exchanger 12.

The provision of such sensing devices, power operated valves and related controls thus provides an automatic means of bringing individual heat exchangers into or out of operation in accordance with temperature variations arising from changes in engine operating conditions. Thermostatic valves may be provided in place of or in addition to power operated valves to provide a similar element of control, and pressure sensors may be provided in place of or addition to temperature sensors.

Various modifications may be made without departing from the invention. For example alternative coolant fluids may be used, including water, freon, ammonia and fluorinated hydrocarbon, a fluorinated hydrocarbon or freon being preferred. Mixtures of these or other fluids may also be employed instead of a single cooling fluid. The fluid or mixture of fluids should have high electrical resistivity. Various different constructions of heat exchanger may be employed including plate-fin, shell and tube, tube-fin, double pipe and spiral tube heat exchangers, and different forms of heat exchanger may be used as the vapour to fan air, vapour to fuel and vapour to ambient air heat exchangers. While in the embodiments described, a single vapour to fan air, vapour to ambient air and vapour to fuel heat exchanger is described, multiple fan air, ambient air or fuel heat exchangers, or heat exchangers having multiple sections or compartments disposed in different locations, may be employed.

While in the embodiments the power electronics are described as being housed within a casing immersed in the coolant liquid, electronic devices such as silicon chips could be directly immersed in the fluid or could be attached either directly or through an intermediate support or module to a wall of the casing.

It should also be appreciated that while the invention has been described primarily with reference to the cooling of power electronics or fuel in gas turbine aircraft engines, the invention may equally be employed in similar situations in marine, rail, road or other vehicles. In the case of rail locomotives heat exchange may be effected with engine fuel or ambient air. In the case of ships or other marine vessels, heat exchange may be effected with engine fuel, ambient air or water. The invention may also be applied to plant operating in desert conditions, heat exchange being effected with cooling water during the day and with ambient air at night when ambient temperatures are low. The invention may also be applied to cooling of components other than electronic components or fuel lines.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

What is claimed is:

1. Apparatus for maintaining the temperature of a component below a predetermined maximum temperature, the apparatus comprising a reservoir for a cooling fluid having a boiling point below said temperature, said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature, and wherein the apparatus is used in a gas turbine engine in which one of said heat exchangers is adapted to effect heat exchange with ambient air drawn from around the engine and a second one of said heat exchangers is adapted to effect heat exchange with engine fuel.

2. Apparatus according to claim 1 wherein both of said heat exchangers are of variable heat exchange capacity, the minimum combined heat exchange capacity of the heat exchangers being sufficient to maintain the temperature of said component below said predetermined maximum temperature.

3. Apparatus according to claim 1 including one or more further heat exchangers of fixed or variable heat exchange capacity, the combined minimum heat exchange capacity of all of said heat exchangers being sufficient to maintain the temperature of said component below said predetermined maximum temperature.

4. Apparatus according to claim 1 for use in a gas turbine engine in which one of said heat exchangers is adapted to effect heat exchange with compressed air derived from a low pressure compressor or fan of the engine.

5. Apparatus according to claim 1 wherein heat is transferred automatically in whichever one or more of said heat exchangers is operable at a particular point in time.

6. Apparatus according to claim 1 wherein said component is disposed adjacent to said reservoir.

7. Apparatus according to claim 6 wherein said reservoir comprises an evaporation region of a heat pipe disposed adjacent to said component, said heat pipe also having opposed end regions comprising elements of respective ones of said heat exchangers.

8. Apparatus according to claim 1 in which said component is immersed in said cooling fluid.

9. Apparatus according to claim 8 including an insulated chamber in fluid communication with the liquid and vapour in said reservoir, said insulated chamber being adapted to extract heat from said component when the cooling effect of said heat exchangers is insufficient to maintain the temperature of said component below said predetermined working temperature.

10. Apparatus according to claim 1 including pump means operable to increase the pressure of vapour within any one or more of said heat exchangers.

11. Apparatus according to claim 10 including throttle means operable to restrict return flow of condensed vapour from the or each pressurised heat exchanger to said reservoir.

12. Apparatus according to claim 11 wherein said throttle means comprises a nozzle disposed adjacent to said component and disposed to discharge returned condensate towards said component.

13. Apparatus according to claim 1 wherein said heat exchangers are disposed above said reservoir such that condensed cooling fluid is returned to said reservoir by gravity.

14. Apparatus according to claim 1 including means operable to ensure return of condensed cooling fluid to said reservoir when the attitude of the reservoir is altered.

15. Apparatus according to claim 14 wherein said means to ensure return of condensed cooling fluid comprises pump means.

16. Apparatus according to claim 1 wherein said cooling fluid is selected from water, freon, ammonia and a fluorinated hydrocarbon.

17. Apparatus according to claim 16 wherein said cooling fluid comprises a mixture of two or more of said fluids.

18. Apparatus according to claim 1 wherein said component comprises a housing containing power electronic devices.

19. Apparatus according to claim 1 wherein said component comprises fuel supply line.

20. A gas turbine engine including apparatus according to claim 1.

21. Apparatus for maintaining the temperature of a component below a predetermined maximum temperature, the apparatus comprising a reservoir for a cooling fluid having a boiling point below said temperature, said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature and wherein said apparatus is used in a gas turbine engine in which one of said heat exchangers is adapted to effect heat exchange with compressed air derived from a low pressure compressor or fan of the engine and wherein a second one of said heat exchangers is adapted to effect heat exchange with engine fuel.

22. Apparatus according to claim 21 wherein a further one of said heat exchangers is adapted to effect heat exchange with ambient air drawn from around the engine.

23. Apparatus for maintaining the temperature of a component below a predetermined maximum temperature, the apparatus comprising a reservoir for a cooling fluid having a boiling point below said temperature, said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature and wherein said apparatus is used in a gas turbine engine in which one of said heat exchangers is adapted to effect heat exchange with compressed air derived from a low pressure compressor or fan of the engine and wherein a further one of said heat exchangers is adapted to effect heat exchange with ambient air drawn from around the engine.

24. Apparatus for maintaining the temperature of a component below a predetermined maximum temperature, the apparatus comprising a reservoir for a cooling fluid having a boiling point below said temperature, said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature and including control means operable to close off communication between one or more of said heat exchangers and said reservoir.

25. Apparatus according to claim 24 wherein said control means comprises thermostatic valves.

26. Apparatus for maintaining the temperature of a component below a predetermined maximum temperature, the apparatus comprising a reservoir for a cooling fluid having a boiling point below said temperature, said component and said cooling fluid being in heat transferable juxtaposition to one another such that heat may transfer therebetween, and two heat exchangers associated with said reservoir and operable to effect condensation of vaporised cooling fluid and return same to said reservoir, the heat exchange capacity of at least one of said heat exchangers being variable between maximum and minimum levels, and the combined heat exchange capacity of the heat exchangers when said variable capacity heat exchanger is operating at its minimum heat exchange capacity being sufficient to maintain the temperature of said component below said predetermined maximum temperature and wherein said means to ensure return of condensed cooling fluid comprises pump means and wherein at least one of said heat exchangers projects from the reservoir in a direction different to the other or others.

27. A method of maintaining the temperature of a component below a predetermined temperature, the method comprising cooling the component by evaporation of a cooling fluid having a boiling point below said temperature, effecting condensation of evaporated cooling fluid by heat exchange with one or more of two heat exchange mediums, the heat exchange capacity of at least one of which is variable between maximum and minimum levels, and maintaining the combined heat exchange capacity of the heat exchange mediums sufficient at all times to maintain the temperature of said component below said predetermined maximum temperature and further including the steps of using the method in a gas turbine engine and wherein one of said heat exchangers exchanges heat with ambient air drawn from around the engine and another one of said heat exchangers exchanges heat with engine fuel.

28. A method according to claim 27 wherein heat exchange is effected selectively in one or more of said heat exchange mediums dependent on variation in heat exchange capacity of said variable capacity heat exchange medium.

29. A method according to claim 27 wherein heat exchange is effected selectively with one or more of said heat exchange mediums dependent on variation in their respective heat exchange capacities.

30. A method according to claim 27 wherein said cooling fluid is selected from water, freon, ammonia and a fluorinated hydrocarbon.

31. A method according to claim 27 wherein said component comprises a housing containing power electronic devices.

32. A method according to claim 27 wherein said component is a fuel supply line.

33. A method of maintaining the temperature of a component below a predetermined temperature, the method comprising cooling the component by evaporation of a cooling fluid having a boiling point below said temperature, effecting condensation of evaporated cooling fluid by heat exchange with one or more of two heat exchange mediums, the heat exchange capacity of at least one of which is variable between maximum and minimum levels, and maintaining the combined heat exchange capacity of the heat exchange mediums sufficient at all times to maintain the temperature of said component below said predetermined maximum temperature and wherein the method is used with a gas turbine engine and one of said heat exchange mediums is maintained in heat exchange relation with the engine fuel.

34. A method of maintaining the temperature of a component below a predetermined temperature, the method comprising cooling the component by evaporation of a cooling fluid having a boiling point below said temperature, effecting condensation of evaporated cooling fluid by heat exchange with one or more of two heat exchange mediums, the heat exchange capacity of at least one of which is variable between maximum and minimum levels, and maintaining the combined heat exchange capacity of the heat exchange mediums sufficient at all times to maintain the temperature of said component below said predetermined maximum temperature and wherein a reservoir for said cooling fluid is provided and a control means is provided and including the step of operating said control means to close off communication between said heat exchange mediums and said reservoir.

* * * * *